(12) United States Patent
Montgomery (10) Patent No.: US 6,258,514 B1
(45) Date of Patent: Jul. 10, 2001

(54) TOP SURFACE IMAGING TECHNIQUE USING A TOPCOAT DELIVERY SYSTEM

(75) Inventor: Melvin W. Montgomery, Camas, WA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/266,174

(22) Filed: Mar. 10, 1999

(51) Int. Cl.[7] .................................. G03C 5/00; G03C 5/16
(52) U.S. Cl. ......................... 430/315; 430/323; 430/324; 430/326
(58) Field of Search ...................... 430/315, 323, 430/324, 326, 327, 313, 314, 302, 310

(56) References Cited

U.S. PATENT DOCUMENTS

| | | | |
|---|---|---|---|
| 5,272,042 | * 12/1993 | Allen et al. | 430/270 |
| 5,320,934 | * 6/1994 | Misium et al. | 430/315 |
| 5,486,424 | * 1/1996 | Nakato et al. | 428/451 |
| 5,665,251 | * 9/1997 | Robertson et al. | 216/22 |
| 5,985,524 | * 11/1999 | Allen et al. | 430/326 |

FOREIGN PATENT DOCUMENTS 11-24272  * 1/1999 (JP).

* cited by examiner

*Primary Examiner*—Shean C. Wu (57) ABSTRACT

An apparatus and method for manufacturing a device using lithography. An underlayer is deposited on a first surface, the underlayer of which is composed of a first resist material adapted to be substantially free of photoacid generators and which includes an acid labile polymer group. A topcoat layer is deposited on top of the underlayer which is composed of a second resist material adapted to be substantially free of acid labile polymer groups and including a photoacid generator. Upon exposure of a portion of the topcoat layer to radiation through to form an exposed region and an unexposed region of a lithographic pattern, photoacid is generated by the topcoat layer and delivered to an interface between the underlayer and the topcoat layer such that the generated photoacid at the exposed region deprotects the acid labile polymer groups at the underlayer top surface to form a deprotected region and a protected region. These two regions cooperate to define an image of the lithographic pattern in the underlayer top surface. The resulting image in the undercoat may then be silylated to form a resistant mask.

39 Claims, 4 Drawing Sheets

TOP SURFACE IMAGING TECHNIQUE USING A TOPCOAT DELIVERY SYSTEM

TECHNICAL FIELD

This present invention relates, generally, to photolithography techniques for patterned plated devices and, more particularly, relates to top surface imaging processes for semiconductor fabrication using a topcoat delivery technique.

BACKGROUND ART

As semiconductor fabrication techniques advance, the minimum feature sizes of integrated circuits (ICs) continue to shrink. Commensurate with this size reduction, various process limitations have made IC fabrication more difficult. One area of fabrication technology in which such limitations have appeared is photolithography.

Briefly, photolithography involves selectively exposing regions of a resist coated silicon wafer to a radiation pattern, and then developing the exposed resist in order to selectively protect regions of wafer layers (e.g., regions of substrate, polysilicon, or dielectric).

An integral component of photolithographic apparatus is a "reticle" which includes a pattern corresponding to features at a layer in an IC design. Such reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist.

The resist (sometimes referred to as a "photoresist") is provided as a thin layer of radiation-sensitive material that is spin-coated over the entire silicon wafer surface. The resist material is classified as either positive or negative depending on how it responds to light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor. For further information on IC fabrication and resist development methods, reference may be made to a book entitled *Integrated Circuit Fabrication Technology* by David J. Elliott, McGraw Hill, 1989.

One problem inherent with photolithography is the Depth Of Focus (DOF) in which the wafer topographic variation of the substrate surface may cause the projected image to exhibit some decreased resolution and other optical distortions. This focus problem of the DOF lens is especially pronounced in IC designs at the high and low plateaus of the submicron features near the wavelength of light used in the photolithography (i.e., 0.25 $\mu$m and smaller).

To address the effects of varied wafer topography, a number of planarization techniques have been developed including planarization layers, reflow, and chemical-mechanical polishing. One such technique is multiple resist processing in which a thick resist underlayer is first deposited atop the substrate surface to fill the valleys for planarization thereof. Subsequently, a thin, "conformal" topcoat layer of positive-acting resist, such as polymethylmethacrylate (PMMA), is deposited on top of the underlayer which functions as the imaging layer. Accordingly, during the exposure process, this generally planar, thin top imaging surface enables the resolution of the pattern image without the adverse resolution effects encountered with the thick resist layers from the steps in the substrate surface.

One top surface imaging technique, in particular, is the Diffusion Enhanced Silylating Resist process or silylation process in which a silicon-rich mask of silicon dioxide ($SiO_2$) is formed on the topcoat layer to provide a more resistant etch mask than conventional bilayer techniques. Typical of these patented silylation processes are disclosed in U.S. Pat. Nos.: 4,751,170; 5,550,007; and 5,665,251. In these processes, after the relatively thick underlayer of photoresist is deposited atop the substrate surface, the underlayer is usually hard baked at temperatures ranging from about 120° C. to about 180° C. for about 90 seconds to about 180 seconds. This process facilitates evaporation of the organic casting solvents employed to assist deposition. As importantly, this hard bake cross-links the photoresist to decompose the photoactive compounds contained therein so that they are no longer sensitive to light. Essentially, an inert planarization cross-linked matrix is formed over the substrate surface.

Subsequently, the thin topcoat layer of photoresist is deposited over the cross-linked underlayer which typically includes photoacid generators, acid labile polymer groups and chemical amplifiers which function to facilitate pattern development upon exposure of the portions thereof to ultraviolet radiation. This topcoat layer is then typically soft baked at temperatures ranging from about 90° C. to about 120° C. for about 30 seconds to about 120 seconds to evaporate the organic casting solvents.

As light, typically in the ultraviolet radiation range, passes through the reticle, the acid generators form a photoacid which enhances the rate of solubilization of the polymer in the areas exposed to the radiation. Briefly, photoacids function by the photolytic formation of Lewis Acids and protonic acids. These photogenerated acids catalyze the deprotection of the acid labile polymer groups or degrade the main chain by acidolysis. In the presence of photoacid, the acid labile group is cleaved from the resin matrix to deprotect the exposed region to enable silylation thereof.

The silylation process may then commence, either by a vapor phase silylation or a liquid phase silylation technique, to incorporate silicon into the radiation exposed regions of the topcoat. Typically, in a vapor phase silylation process, the wafer is placed in a chamber for exposure to a silicon-bearing compound, such as the silylating reagent hexamethyldisilazane (HMDS). In contrast, in a liquid phase silylation process, the exposed topcoat layer is dipped in a 10% Hexamethyldisilizane and 90% Xylene (warmed to 50° C. w/1 gram A-methyl perolidone) bath which displaces an active proton, and incorporates a trimethylsilyl group.

The image may then be "developed" using oxygen plasma etching. During an anisotropic Reactive Ion Etching (RIE) process, the silylated region is converted to silicon dioxide ($SiO_2$) mask. The top surface area not protected by the $SiO_2$ mask and its underlying material can then be etched away by the RIE etch.

While this imaging technique satisfactorily addresses many DOF issues, several other problems are inherent with this process. For example, this conventional silylation technique is relatively time consuming to perform. Since both a hard bake and a soft bake are usually required in this process, at least two bake plates are required. Thus, cycle time is increased which in turn reduces efficiency and increases manufacture cost.

Another problem associated with this technique is that during the silylation process, $SiO_2$ is added to the exposed region. Accordingly, swelling of the silylated region may occur which often distorts the final resist pattern. In turn, the feature size of the implant or etch can ultimately be affected. Accounting for or compensating for such swelling is also difficult to implement since it varies from wafer to wafer. Therefore, this adverse side effect is not easily reproducible and is most unpredictable.

Another top surface imaging technique which addresses the Depth of Focus problem is to provide a very dark resist imaging layer in either a single or multiple resist process. Due to the optical properties of the dark resist, the penetration depth of the radiation during exposure is confined to only about 400 Å into the top surface and then is absorbed by the film. Therefore, better image resolution of the lithographic pattern can be accommodated since the light will not be affected by the substrate topography. Typical of these patented processes are disclosed in U.S. Pat. No. 5,023,164.

The primary problem associated with this technique, however, is that the ability to restrict and contain the acid migration of the lithographic pattern is reduced. Although the penetration depth of the radiation is confined to the top surface, the photoacid generators present in the resist may cause excessive photoacid generation which in turn produce adverse acid migration when overexposed. For example, too deep a vertical migration of the photo acid also results in adverse lateral erosion of the pattern and the undesirable deposition of residue in the etch. During the silylation process, hence, the necessary degree of silylation is difficult to control since the depth of the silylating reagent cannot be determined. In turn, the ability to control the pattern is less defined. In contrast, too shallow a radiation penetration produces inadequate etch selectivity.

DISCLOSURE OF INVENTION

In accordance with the present invention, a method for manufacturing a device is provided including the steps of: depositing an underlayer on a substrate surface comprising a first resist material being substantially photoacid generator-free and including an acid labile polymer group; and depositing a topcoat layer on the deposited underlayer comprising a second resist material being substantially free of acid labile polymer groups and including a photoacid generator. The next step of the present invention includes; forming a lithographic pattern on a top surface of the underlayer by exposing a portion of the topcoat layer to radiation to form an exposed region and an unexposed region. In the exposed region, photoacid generation is caused at an interface between the underlayer and the topcoat layer such that the generated photoacid at the exposed region deprotects the acid labile polymer groups at the underlayer top surface to form a deprotected region and a protected region. These two regions cooperate to define an image of the lithographic pattern in the underlayer top surface. The present invention then provides the step of masking the underlayer top surface.

In one aspect of the present invention, the masking step includes the step of silylating the underlayer top surface to silylate only the deprotected region. After the silylating step, the masking step further includes the step of etching the exposed substrate surface. This etching step may be performed by Reactive Ion Etching (RIE).

In another aspect of the present invention, a method of forming a circuit pattern on a substrate surface is provided including the steps of: forming an underlayer on a substrate surface comprising a first resist material being substantially photoacid generator-free and including acid labile polymer groups; and soft baking the underlayer. Subsequently, the next step includes forming a topcoat layer on the soft baked underlayer comprising a second resist material being substantially free of acid labile polymer groups and including a photoacid generator. The second resist material being substantially non-soluble with the first resist material when deposited on the underlayer. The present method then includes the step of forming a lithographic pattern on a top surface of the underlayer by exposing a portion of the topcoat layer to radiation to form an exposed region and an unexposed region. Photo acid is generated at an interface of the exposed region between the underlayer and the topcoat layer. This generated photoacid deprotects the acid labile polymer groups at the underlayer top surface to form a deprotected region and a protected region which together cooperate to define an image of the lithographic pattern in the underlayer top surface. The next step includes silylating the underlayer top surface.

The forming the underlayer step of the present inventive method may include the step of applying the underlayer with a casting solvent which is an organic based solvent, while the depositing a topcoat layer step includes the step of applying the topcoat layer with a water-based casting solvent. In still another aspect of the present invention, before the silylating step, the inventive method may include the step of stripping the topcoat layer to expose the surface of the underlayer thereby allowing silylation of the imaged surface.

BRIEF DESCRIPTION OF THE DRAWING

The assembly of the present invention has other objects and features of advantage which will be more readily apparent from the following description of the best mode of carrying out the invention and the appended claims, when taken in conjunction with the accompanying drawing, in which:

BEST MODE OF CARRYING OUT THE INVENTION

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 1:
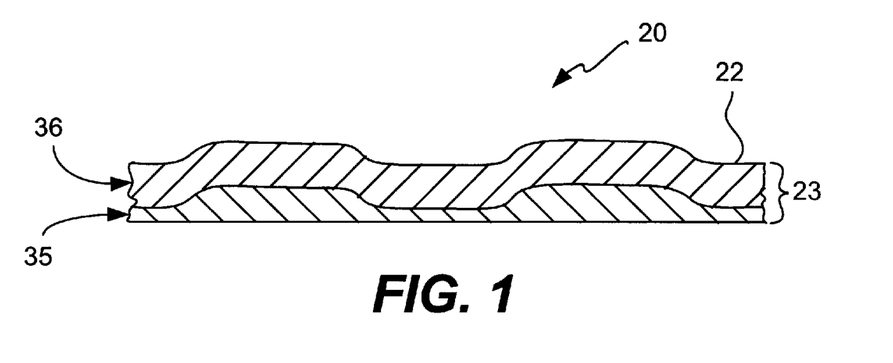
FIG. 1 is a fragmentary side elevation view, in cross-section, of a substrate assembly prepared for etching using the method and technique applied in accordance with the present invention.
Figure 2:
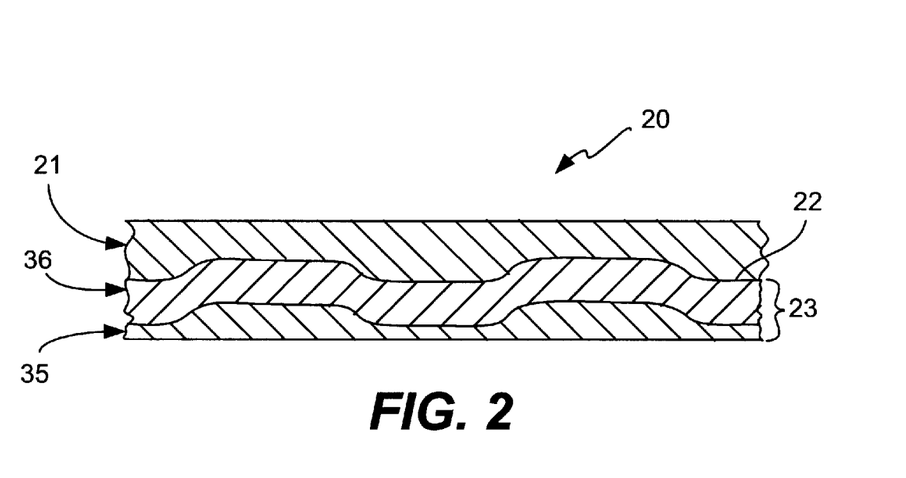
FIG. 2 is a fragmentary side elevation view, in cross-section, of the substrate assembly of FIG. 1 having an underlayer deposited on the top surface of the substrate assembly of a photoacid generator-free, first photoresist material constructed in accordance with the present invention.
Figure 3:
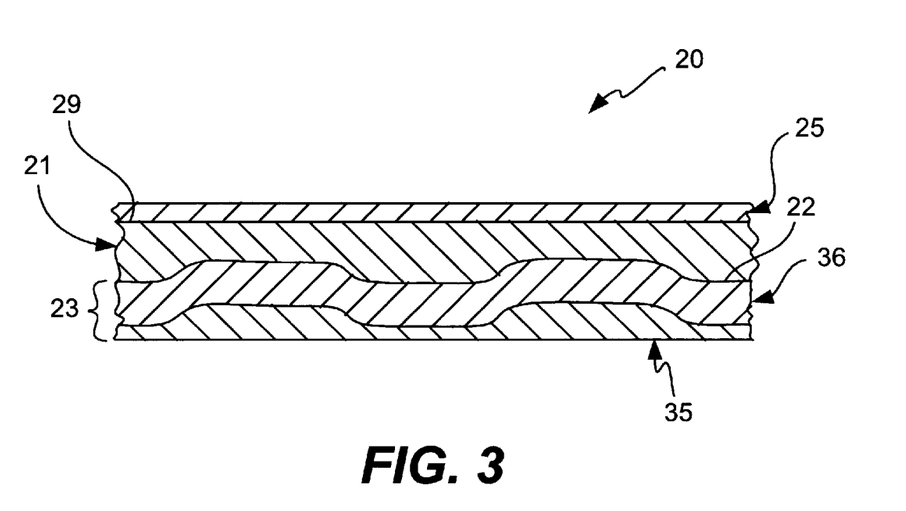
FIG. 3 is a fragmentary side elevation view, in cross-section, of the substrate assembly of FIG. 2 including a topcoat layer deposited on the top surface of the underlayer of a second photoresist material including a photoacid generator constructed in accordance with the present invention.
Figure 6:
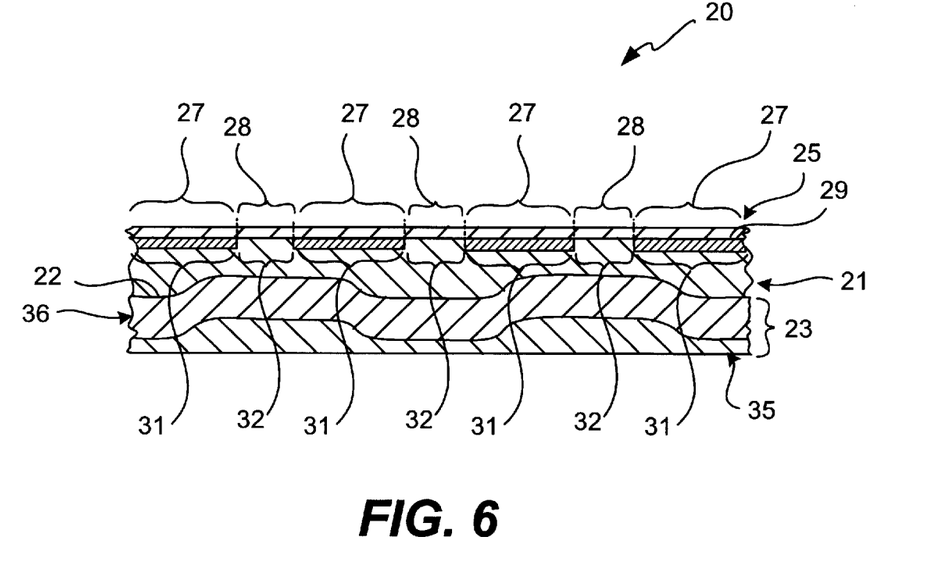
FIG. 6 is a fragmentary side elevation view, in cross-section, of the substrate assembly of FIG. 5 showing the lithographic patterned deprotection of the immediate underlying region of the first photoresist material in contact with the generated photoacid.
Figure 7:
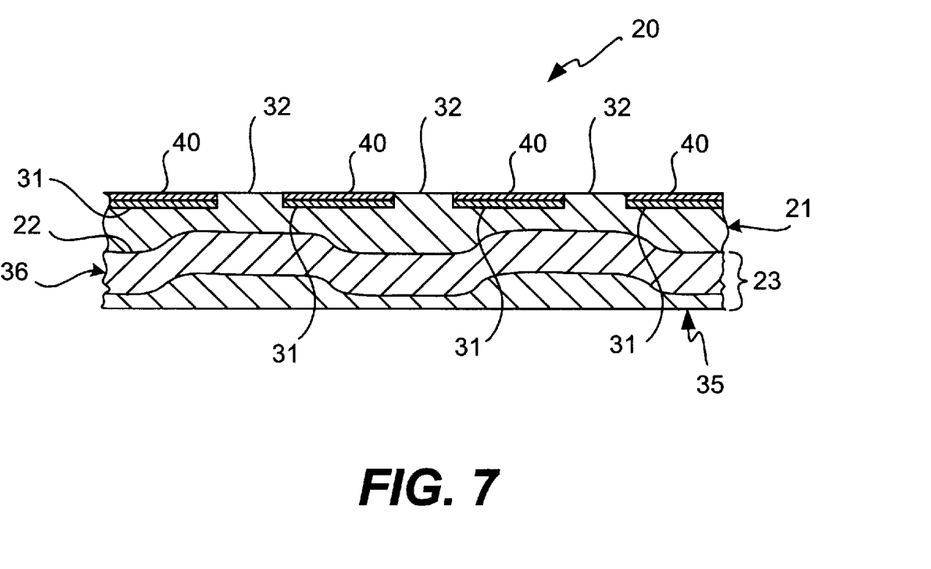
FIG. 7 is a fragmentary side elevation view, in cross-section, of the substrate assembly of FIG. 6 illustrating silylation of the deprotected area.

Attention is now directed to FIGS. 1–9 where a method for manufacturing a device, generally designated 20, is provided including the steps of: depositing an underlayer 21 on a first surface 22 of a substrate assembly 23 comprising a first resist material being substantially photoacid generator-free and including an acid liable polymer group (FIG. 2); and depositing a topcoat layer 25 on the deposited underlayer 21 comprising a second resist material including a photoacid generator (FIG. 3). As best viewed in FIG. 4, the present invention next includes the step of forming a lithographic pattern on a top surface of the underlayer 21 by exposing a portion of the topcoat layer 25 to radiation (represented by arrows 26) to form an exposed region 27 and an unexposed region 28. In the exposed region 27, photoacid generation (FIG. 5) is caused at an interface 29 between the underlayer 21 and the topcoat layer 25 such that the generated photoacid 30 at the exposed region 27 deprotects the acid liable polymer group at the underlayer top surface to form a deprotected region 31 and a protected region 32 (FIG. 6). These two regions cooperate to define an image of the lithographic pattern in the top surface of the underlayer 21. The present invention further includes the step of masking the underlayer top surface (FIG. 7).

Accordingly, the disclosed process employs true top surface imaging techniques to produce integrated circuits with submicron features. Unlike the present multiresist processes, adverse acid migration which may erode the resulting lithographic image is substantially reduced primarily by eliminating photoacid generators from the composition of the first resist material of the underlayer. Therefore, when the lithographic patterned photoacid 30 is delivered to the interface between the topcoat layer and the underlayer, the deprotection of the labile acid groups contained in the exposed region is substantially confined to the top surface of the underlayer.

Thus, the lack of photoacid generators in the first resist material of the underlayer substantially eliminates adverse acid migration so that lithographic pattern can be easily controlled.

Briefly, for simplicity, the following description of the present invention will be framed toward positive resist materials; however, it should be understood that negative resist materials may be substituted as well.

Referring back to FIG. 1, a typical substrate assembly 23 is shown which may be provided by any conventional substrate material such as a silicon substrate. Typically, substrate assembly 23 represents a wafer or the like employed in semiconductor fabrication. In the illustrated examples, the substrate assembly 23 may include a first silicon layer 35 and a second silicon layer 36 deposited on top of the first silicon layer 35. Thus, the first surface 22 may be provided by the upper surface of the second silicon layer 36.

The first resist material is then deposited atop second silicon layer 36 using conventional techniques such as spin deposition or the like to form the underlayer 21. It will be appreciated that any other coating technique for both the underlayer 21 and the topcoat layer 25 may be employed without departing from the true spirit and nature of the present invention. Further, while the underlayer is preferably utilized as a thicker planarization layer, it will be understood that the underlayer may be as relatively thin as the topcoat layer as well. Preferably, the thickness of the underlayer is in the range of about 0.5 $\mu$m to about 4.0 $\mu$m.

The first photoresist material composing the underlayer 21 may be provided by any conventional photoresist such as poly(vinyl alcohol) and its vinylacetate copolymers, poly (vinylphenol), poly (vinylmethylphenol)s, the cresol novolacs, poly(vinyl-resorcinol), poly (vinylcatechol), poly (vinylpyrogallol), resorcinol novolac, catechol novolac, the poly(vinylphenol)s, and the phenol resins. Further, the first photoresist material of the underlayer 21 is intermixed with an organic casting solvent to facilitate deposition thereof on the second silicon layer 36 of the substrate assembly 23. Use of such organic casting solvents used in typical spin coat applications enable smooth coating of the underlayer 21 for more effective planarization. Typical of these organic solvents employed include propylene glycol monoether (PM) acetate, ethyl lactate and ethoxy ethyl propionate.

In the accordance with the present invention, the first resist material includes acid labile polymer groups (also including protecting group polymers and leaving group polymers) which in the presence of acid deprotect selected portions of the photoresist for silylations. Subsequently, as will be described in greater detail below, silylation of the deprotected region may commence.

Briefly, an acid labile polymer is a polymer group that, in the presence of acid, is the chemically dissociable or dissociated from the backbone polymer to yield soluble products. Typical of the preferred acid labile pendant groups are (1) tertiary butyl esters of carboxylic acids and (2) tertiary butyl carbonates of phenols, as well as trityl, benzyl, and benzhydrl modifications and derivatives thereof. Exemplary polymers are poly (p-tert-butoxycarbonyloxy-alpha-methylstyrene), poly (p-tert-butoxycarbon-yloxy-styrene), poly (tert-butyl p-vinylbenzoate), poly (tert-butyl p-isopropenylphenyloxyacetate), and poly (tert-butyl methacrylate), as well as copolymers and mixtures thereof such as poly (tert-butylmethacrylate-co-meth-acrylate-co-methacrylic acid). Further, while vinyl polymers are preferred, it is of course, to be understood that heterochain polymers, as condensation polymers, and addition polymers, having the required pendant groups may also be utilized.

Moreover, in the present invention, the first photoresist material of the underlayer 21 is completely absent of or has a substantially low percentage of photoacid generator therein. Preferably, the percentage of photoacid generators in the first photoresist material is not to exceed about 0.01% (by weight), and is thus defined as being "substantially free of photoacid generators". Such photoacid generators are, however, included in the second resist material of the topcoat layer 25 and will be described in greater detail below.

The preferred next step in accordance with the present invention, after depositing the underlayer, is soft baking the underlayer 21 to cure and reflow the first photoresist material so that the top surface thereof becomes more planar. Further, this procedure facilitates evaporation of the organic casting solvents from the photoresist. Preferably, the soft baking step is performed by placing the substrate assembly 23, mounted to a bake plate (not shown). Where the substrate assembly 23 is baked at a sufficient temperature and for a sufficient amount of time to cure the first photoresist material. However, this soft bake procedure must not be at such a high temperature and be for so long as to substantially decompose the active compounds therein, such as the acid labile polymer groups contained in the first photoresist material. Such active compounds, therefore, still maintain their chemical activity, and are not cross-linked. Preferably, the soft bake parameters are in the range of about 90° C. to about 140° C. for about 15 minutes to about 60 minutes. More preferably, the soft baking step is performed at about 90° C. for about 30 minutes.

Turning now to FIG. 3, the second photoresist material of the topcoat layer 25 is deposited atop the underlayer 21 through conventional spin deposition or the like. This topcoat layer is preferably relatively thin, and may be comprised of the same photoresist materials as that of the underlayer. Again, to facilitate spin deposition, a casting solvent is intermixed with the second resist material. This casting solvent, however, must be nonsoluble or a nonsolvent with the first photoresist material so that upon application the second photoresist material will not cause stripping of the underlayer 21. This is imperative, since, unlike the current multiresist techniques, the first photoresist material composing the underlayer 21 is not cross-linked, and would therefore be substantially solubl e with a casting solvent of the same or similar base.

In the preferred form, the casting solvent of the s econd photoresist material is water-based, while that of the first photoresist material is organic-based. It will be appreciated, however, that the base of the casting solvents for the first and second resist materials may be reversed, and that other base solvents may be applied as long as the two casting solvents are generally insoluble with one another during application.

As set forth above, the second photoresist material of the topcoat layer 25 includes a conventional photoacid generator which, upon radia tion exposure, provides a free r adical or ionic species-type photoacid. These photo acid generators are better described in U.S. Pat. No. 5,272,042 incorporated by reference herein. Moreover, as will be better detailed below, the second photoresist material of the topcoat layer 25 preferably is absent of or has a substantially low percentage of acid labile pendant group polymers therein. Essentially, the second photoresist material is preferably considered to be "substantially free of acid labile pendant polymer groups".

Similar to the deposition of the underlayer 21, after depositing the topcoat layer 25, the substrate assembly 23 is again soft baked to evaporate of water-based casting solvent, and to cure and reflow the second photoresist material so that the top surface thereof becomes more planar. Unlike the current multiresist techniques, the substrate assembly need not be removed from the supporting bake plate employed in the first soft baking step for the first photoresist material. Accordingly, labor and cycle time are reduced, both of which decrease manufacture costs.

Preferably, the soft baking step for the second resist material is performed by baking the substrate assembly 23, already mounted to a bake plate, at temperatures in the range of about 90° C. to about 140° C. for about 45 seconds to about 75 seconds, and more preferably, at about 120° C. for about 60 seconds. Again, this soft bake assures that the active polymers contained in the second photoresist material, such as the photoacid generators, will not substantially decompose during cross-linking.

Figure 4:
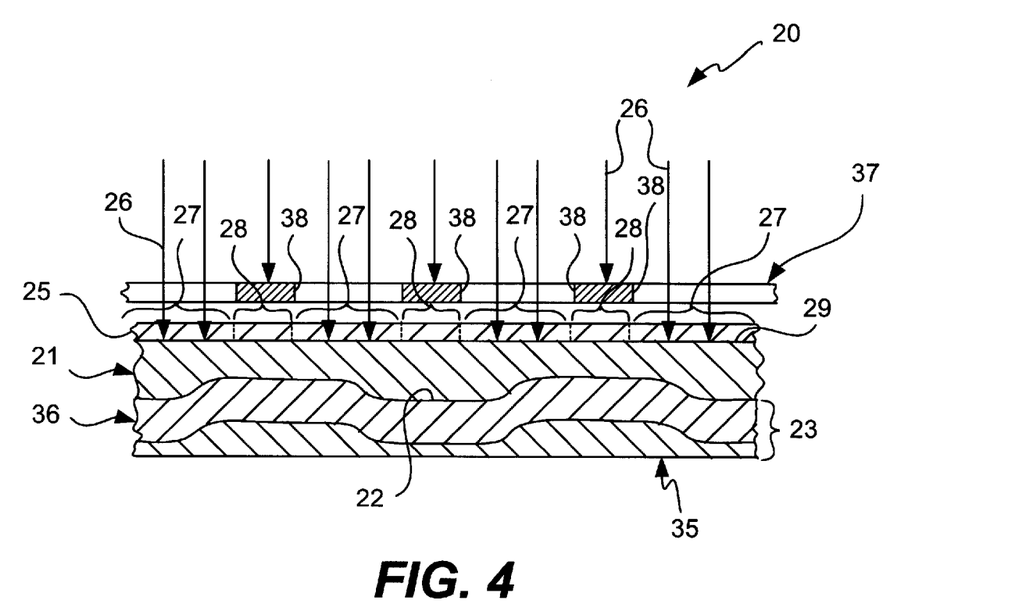
FIG. 4 is an enlarged, fragmentary, side elevation view, in cross-section, of the substrate assembly of FIG. 3 illustrating a lithographic patterned radiation exposure of the second photoresist material of the topcoat layer through a reticle.
Figure 5:
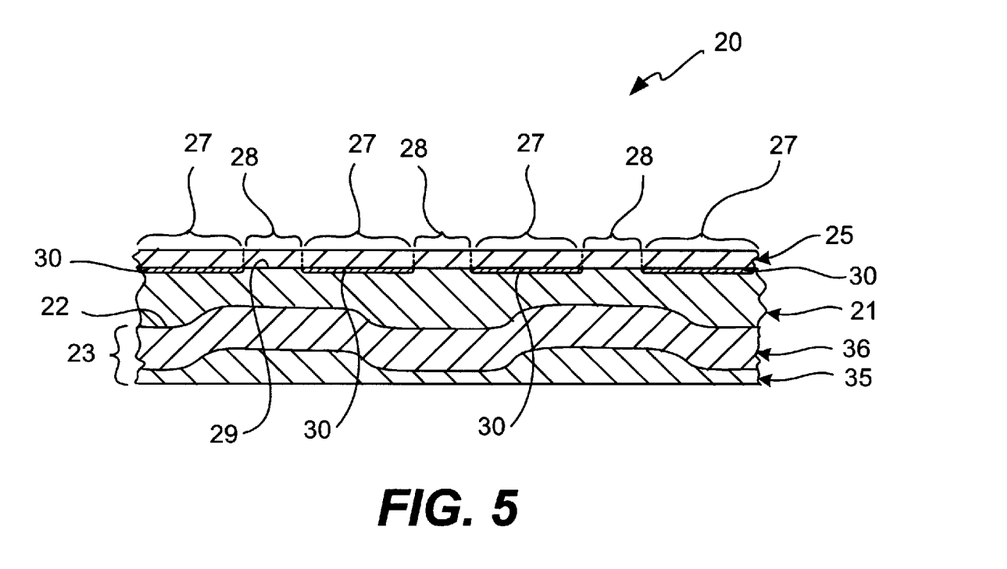
FIG. 5 is a fragmentary side elevation view, in cross-section, of the substrate assembly of FIG. 4 illustrating photoacid generation of the exposed second photoresist material at the interface between the topcoat layer and the underlayer.

FIG. 4 illustrates the step of forming a lithographic pattern on a top surface of underlayer 21 by exposing a portion of the topcoat layer 25 to radiation to dichotomize the second resist material into an exposed region 27 and an unexposed region 28. This step is best performed using a conventional reticle device, generally designated 37, to form the image of the lithographic pattern on the topcoat surface.

Briefly, the radiation is preferably provided by ultraviolet radiation having a wavelength in the range of about 7 nm to about 25 nm. However, radiation with a wavelength in the x-ray range of about 10 nm to about 20 nm is also advantageous in the manufacture process of the present invention.

As the radiation passes through patterned apertures 38 in the reticle device 37, the light rays (represented by arrows 26) impinge the exposed regions of the second resist material which induces chemical reactions in the form of photoacid generation. However, in accordance with the present invention, since the second resist material lacks any acid labile pendant groups, the topcoat layer 25 merely functions as a photoacid carrier adapted to deliver photoacid 30 in the pattern of the exposed region to the interface 29 between the underlayer 21 and the topcoat surface. A pattern, therefore, is generated within the second resist material due to the generation of photoacid.

Upon delivery of the photoacid 30 at the interface 29 to the top surface of the underlayer 21 (FIG. 5), the acid catalyzed deprotection or main chain scission of the acid labile pendant polymer group contained therein is initiated. Preferably, the species that initiates the acid catalyzed deprotection of the polymer is a sulfonate. The trifluoromethyl sulfonate ion (triflate ion) is the product of a trifluoromethyl sulfonic acid (triflate) precursor that generates a strong acid upon exposure to near ultra-violet or visible radiation in the presence of a suitable photoactive compound.

As shown in FIG. 6, the acid catalyzed deprotection of the acid labile pendant group forms a deprotected region 31. Together, the deprotected region 31 and the protected region 32 cooperate to define the image of the lithographic pattern in the underlayer top surface. Importantly, since the first resist material is absent of or is substantially absent of photoacid generators, exposure to radiation through the reticle does not generate photoacid within the underlayer to induce scission throughout the first resist material. The deprotected region 31, therefore, is generally confined to the top surface of the first resist material of the underlayer 21. Moreover, adverse acid migration, especially laterally, is substantially eliminated so that the formation of the lithographic pattern is substantially more controllable.

Once the scission of the acid labile pendant polymer group has occurred to "deprotect" this region (i.e., the deprotected region) of the underlayer 21, a selectivity is introduced into the first resist material so that the initial step of the silylation process can commence (FIG. 7). This silylation step may be performed using either vapor phase silylation or through liquid phase silylation. In either process, a silylating reagent 40 will be introduced which will selectively react with the first resist material in one of either the deprotected regions 31 (in a positive resist) or the protected regions 32 (in a negative resist), but not both, into the underlayer 21. The silylating reagent preferentially reacts with the resist material in only one region. Due to this preferential reaction, the silylating reagent is selectively diffused into one of the exposed or unexposed regions of the resist material. Typical of these silylating reagents include N,N-dimethylamino-pentamethyldisilane, N-methylaminopen-tamethyldisilane, chloropentamethyldisilane, and N-N,dimethylaminodimethyldisilane, and hexamethydisilizane. The preferred silylating reagent, however, is N,N-dimethylaminopenta-methyldisilane.

In accordance with the present invention, the diffusion of the silylating reagent into the deprotected region 31 can be confined substantially to the top surface of the underlayer 21, as represented by sylated regions 40 in FIG. 7, since the interface delivered photogenerated acids which catalyze the deprotection of the acid labile polymer groups are generally confined to the top surface thereof as well. Thus, the pathlength of the silylating reagent is substantially restricted so that the silylation will not laterally or vertically migrate too far.

In vapor phase silylation, the silylating reagent is generally in a gaseous state when introduced into the resist material. For gaseous reactions, the silylation temperature is preferably about 70° C. to about 130° C. Silylation occurs under a pressure that is less than atmospheric, preferably in the range of about 10 Torr to about 200 Torr, and more preferably at a pressure of about 30 Torr. The silylating reagent is either introduced as a single gaseous species, or combined with another gas in which the partial pressure of the silylating reagent is about 0.20 to about 0.99 percent of the total pressure of the silylating atmosphere.

When vapor phase silylation is employed, the topcoat layer 25 must first be stripped to the interface 29 so that the surface of the underlayer 21 is exposed. In this manner, the imaged surface defined by the protected region 32 and deprotected region can then be exposed to the silylating reagent. This is best performed using conventional stripping techniques and the appropriate solvents.

It will be appreciated, however, that a nonsolvent to the first resist materials must be employed so that the underlayer 21 will not be inadvertently stripped. Preferably, the stripping solvent is water-based, such as polyacrylic acid or polyvinyl pyrolidone, since the casting solvents of the second resist materials is water-based while that of the first resist material is organic-based.

If the silylation process is performed by liquid phase silylation, the silylation solution is preferably primarily a nonsolvent with the first resist material of the underlayer 21. This assures that the silylating solution will not substantially strip the underlayer 21 during the silylation process. The silylating solution, therefore, should not preferably primarily organic-based.

In the preferred embodiment, however, the silylating solution is primarily a solvent for the second resist material of the topcoat layer 25. This preferably water-based silylating solution initially functions to strip to the second resist material to the interface region for exposure of the protected region 32 and deprotected region to the silylating reagent. Subsequently, the silylating reagent contained in the same solution diffuses with the deprotected region 31.

It will be understood, however, that the stripping of the topcoat layer 25 may be perform in a separate step, as mentioned above in the vapor phase silylation technique without, departing from the true spirit and nature of the present invention.

When performing liquid phase silylation, the second resist material is preferably formulated to be substantially free of acid labile polymer groups. In this manner, the topcoat layer 25 will not be susceptible to silylation during the liquid phase silylation step since the acid labile polymer groups would not be "deprotected" in the presence of the photoacid 30 generated during radiation exposure. It will be understood that while silylation of the topcoat layer would not per se prevent stripping of the second resist material since the silylating solution is preferably water-based, such simultaneous silylation would substantially slow the stripping thereof.

Although the silylating solution is primarily a nonsolvent to the first resist material of the underlayer 21, a small quantity of organic-based solvent may be included in the solution. The presence of such solvent enables minute extraction of the surface of first resist material to facilitate diffusion of the silylating reagent therein. In the present invention, liquid phase silylation is best performed when the temperature of the silylating solution is about 20–30° C.

Figure 8:
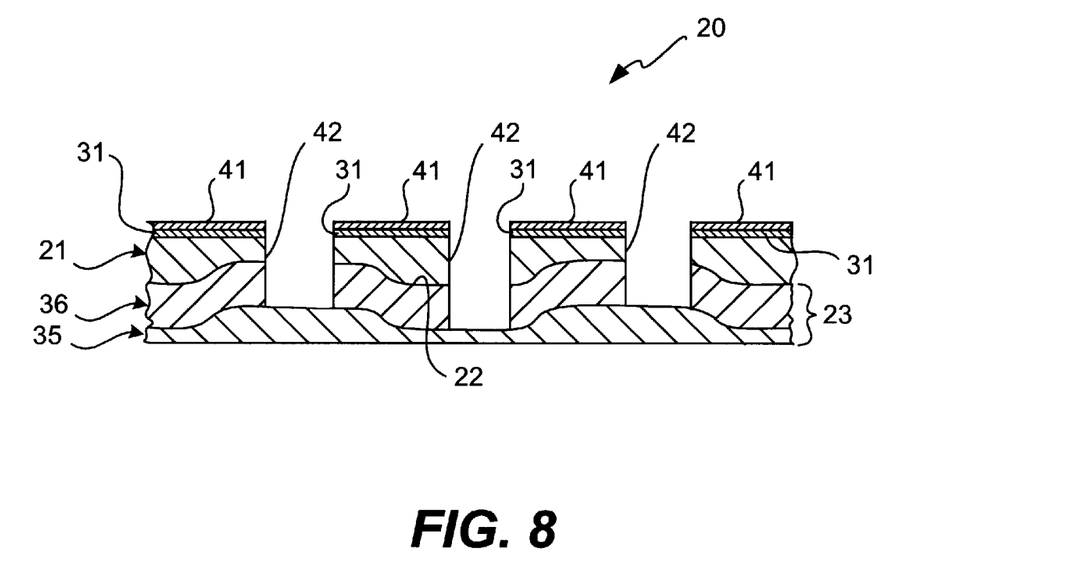
FIG. 8 is a fragmentary side elevation view, in cross-section, of the substrate assembly of FIG. 7 illustrating formation of the silicon dioxide hard mask during the Reactive Ion Etching (RIE) process.

Turning now to FIG. 8, the process of the present invention next includes the step of etching the substrate assembly 23 to expose the second silicon layer 36 thereof. In accordance with the silylation process, upon subjection of the exposed surface of the underlayer 21 to etching, the silylated portions 40 (FIG. 7) of the resist film become oxidized (as represented by oxidized regions 41 in FIG. 8). A silicon-rich mask of silicon dioxide ($SiO_2$) is formed on the silylated "deprotected" region 31 of the underlayer 21 to provide an etch mask (oxidized regions 41) which is substantially more resistant to the etch than the unsilylated "protected" region 32 of the underlayer, depending upon the specific etch conditions. (U.S. Pat. No. 5,550,007 incorporated by reference herein).

During the etching step, the unsilylated "protected" regions 32 and the underlying first resist material of the underlayer 21 will be etched away to form via or contact holes 42. Briefly, these via or contact holes 42 are adapted to receive metal or conductive plugs therein.

In the preferred embodiment, the etching step is best performed through Reactive Ion Etching (RIE) to etch through the protected region 32 of the underlayer 21 and further through the second silicon layer 36. This RIE etch preferably takes place in a plasma that contains a reactive oxygen species, such as $NO_2$, $NO$, $CO_2$, $SO_3$, $SO_2$, $O_2$, and the like gases. Most preferably, the RIE etch is performed in $O_2$ plasma.

Figure 9:
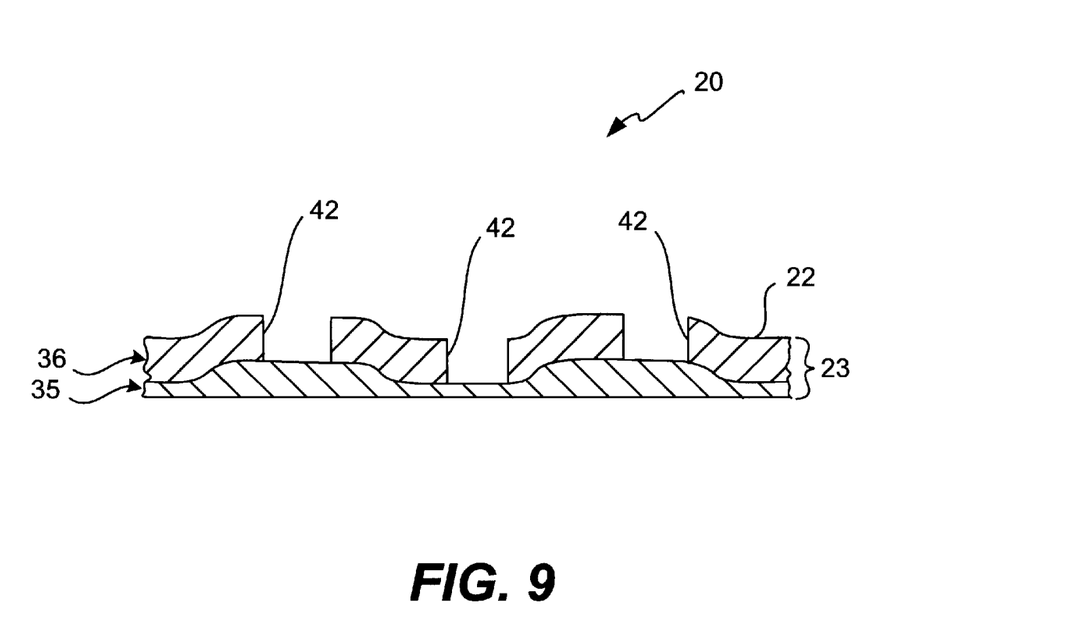
FIG. 9 is an enlarged, fragmentary side elevation view, in cross-section, of the substrate assembly of FIG. 1 after etching and stripping of the underlayer of the material constructed in accordance with the present invention.

Subsequently, as best viewed in FIG. 9, the underlayer is stripped to expose the surface of the first silicon layer 35. This stripping step is best performed using conventional stripping techniques and the appropriate solvents such as oxygen plasma or carbon tetrafloride ($CF_4$).

In an alternative embodiment of the present invention, the first surface 22 of FIG. 1 may be provided by a hard baked photoresist layer 35 upon which the underlayer 21 is deposited over. Hard baked photoresist tends to be substantially more stable than soft baked photoresist, and is thus advantageous in some instances. Moreover, this hard baked photoresist layer 35 may be utilized as a planarization layer in a manner enabling the first resist material of the underlayer 21 to be deposited thereatop relatively planar and relatively thin.

What is claimed is:

1. A method of top surface imaging for manufacturing a device comprising the steps of:

depositing an underlayer on a substrate surface comprising a first resist material being substantially free of photoacid generators and including acid labile polymer groups;

depositing a topcoat layer on the deposited underlayer comprising a second resist material including a photoacid generator;

forming a lithographic pattern on a top surface of said underlayer by exposing a portion of the topcoat layer to radiation to form an exposed region and an unexposed region, said exposed region causing photoacid generation at an interface between the underlayer and the topcoat layer such that the generated photoacid at the exposed region deprotects the acid labile polymer groups at the underlayer top surface to form a deprotected region, which is substantially confined to the underlayer top surface, and a protected region which cooperate to define an image of the lithographic pattern in the underlayer top surface; and masking the underlayer top surface.

2. The method as defined in claim 1 further including the step of:

said masking step includes the step of silylating the underlayer top surface to silylate only the deprotected region.

3. The method as defined in claim 2 further including the step of:

before the depositing a topcoat layer step, soft baking the underlayer at a sufficient temperature and time period to cure the underlayer, while being insufficient to decompose the photoactive compounds of the acid labile polymer groups.

4. The method as defined in claim 3 wherein, said soft baking of the underlayer is performed in the range of about 90° C. to about 140° C. for about 15 minutes to about 60 minutes.

5. The method as defined in claim 4 wherein, said soft baking is performed at about 90° C. for about 30 minutes.

6. The method as defined in claim 1 wherein, said depositing an underlayer step includes the step of applying the underlayer with a casting solvent.

7. The method as defined in claim 1 wherein, said second resist material is substantially non-soluble with said first resist material when deposited on said underlayer.

8. The method as defined in claim 7 wherein, said depositing a topcoat layer step includes the step of applying the topcoat with a casting solvent which is substantially non-soluble with said first resist material when deposited on said underlayer.

9. The method as defined in claim 8 wherein, said casting solvent is an organic based solvent.

10. The method as defined in claim 9 wherein, said depositing a topcoat layer step includes the step of applying the topcoat layer with a water-based casting solvent.

11. The method as defined in claim 2 wherein, after said silylating step, the masking step further includes the step of etching the exposed substrate surface.

12. The method as defined in claim 11 wherein, said etching step is performed by Reactive Ion Etching (RIE).

13. The method as defined in claim 2 further including the step of:

before said silylating step, developing the lithographic pattern.

14. The method as defined in claim 13 wherein, said developing step includes the step of stripping said topcoat layer to expose the surface of the underlayer.

15. The method as defined in claim 2 wherein, said silylating step is performed by vapor phase silylation including a silylating reagent.

16. The method as defined in claim 15 wherein, the silylating reagent is provided by Hexamethyldisilane.

17. The method as defined in claim 15 further including the step of:

before said silylating step, stripping said topcoat layer to expose the surface of the underlayer.

18. The method as defined in claim 2 wherein, said silylating step is performed by liquid phase silylation including a silylating reagent.

19. The method as defined in claim 18 wherein, said topcoat layer is substantially free of protecting-group polymers.

20. The method as defined in claim 18 wherein, the silylating reagent is provided by Hexamethyldisilane.

21. The method as defined in claim 1 wherein, said forming step includes the step of irradiating the exposed portion of the topcoat to light having a wavelength in ultraviolet range.

22. A method of forming a circuit pattern on a substrate surface applying top surface imaging comprising the steps of:

forming an underlayer on a substrate surface comprising a first resist material being substantially free of photoacid generators and including acid labile polymer groups;

soft baking the underlayer;

forming a topcoat layer on the soft baked underlayer comprising a second resist material being substantially free of acid labile polymer groups and including a photoacid generator, said second resist material being substantially non-soluble with said first resist material when deposited on said underlayer;

forming a lithographic pattern on a top surface of said underlayer by exposing a portion of the topcoat layer to radiation to form an exposed region and an unexposed region, said exposed region causing photoacid generation at an interface between the underlayer and the topcoat layer such that the generated photoacid at the exposed region deprotects the acid labile polymer groups at the underlayer top surface to form a deprotected region, which is substantially confined to the underlayer top surface, and a protected region which cooperate to define an image of the lithographic pattern in the underlayer top surface; and silylating the underlayer top surface.

23. The method as defined in claim 22 wherein, said soft baking step is performed in the range of about 90° C. to about 140° C. for about 15 minutes to about 60 minutes.

24. The method as defined in claim 23 wherein,
said soft baking is performed at about 90° C. for about 30 minutes.

25. The method as defined in claim 22 wherein,
said forming the underlayer step includes the step of applying the underlayer with a casting solvent.

26. The method as defined in claim 23 wherein,
said casting solvent is an organic based solvent.

27. The method as defined in claim 26 wherein,
said depositing a topcoat layer step includes the step of applying the topcoat layer with a water-based casting solvent.

28. The method as defined in claim 22 further including the step of:
after said silylating step, etching the exposed substrate surface.

29. The method as defined in claim 28 wherein,
said etching step is performed by Reactive Ion Etching (RIE).

30. The method as defined in claim 22 further including the step of:
before said silylating step, developing the lithographic pattern.

31. The method as defined in claim 30 wherein,
said developing step includes the step of stripping said topcoat layer to expose the surface of the underlayer.

32. The method as defined in claim 22 wherein,
said silylating step is performed by vapor phase silylation including a silylating reagent.

33. The method as defined in claim 32 wherein,
the silylating reagent is provided by Hexamethyldisilane.

34. The method as defined in claim 22 wherein,
before said silylating step, stripping said topcoat layer to expose the surface of the underlayer.

35. The method as defined in claim 22 wherein,
said silylating step is performed by liquid phase silylation including a silylating reagent.

36. The method as defined in claim 35 wherein,
the silylating reagent is provided by Hexamethyldisilane.

37. The method as defined in claim 22 wherein,
said forming step includes the step of irradiating the exposed portion of the topcoat to light having a wavelength in ultraviolet range.

38. The method as defined in claim 1 wherein,
said underlayer is composed of at most about 0.01% of a photoacid generator by weight.

39. The method as defined in claim 22 wherein,
said underlayer is composed of at most about 0.01% of a photoacid generator by weight.

* * * * *